United States Patent
Divakaruni et al.

(10) Patent No.: US 7,190,042 B2
(45) Date of Patent: Mar. 13, 2007

(54) SELF-ALIGNED STI FOR NARROW TRENCHES

(75) Inventors: Ramachandra Divakaruni, Somers, NY (US); Jack A Mandelman, Stormville, NY (US); Carl J Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 10/722,353

(22) Filed: Nov. 25, 2003

(65) Prior Publication Data

US 2004/0113230 A1 Jun. 17, 2004

Related U.S. Application Data

(62) Division of application No. 09/885,790, filed on Jun. 20, 2001, now Pat. No. 6,693,041.

(51) Int. Cl.
*H01L 21/336* (2006.01)
*H01L 29/00* (2006.01)

(52) U.S. Cl. ............... 257/510; 257/330; 257/331; 257/511; 257/509; 438/221; 438/296

(58) Field of Classification Search ........... 257/509, 257/510, 511, 327, 328, 329, 330, 331; 438/221, 438/296, 224
See application file for complete search history.

(56) References Cited

U.S. PATENT DOCUMENTS

| | | | |
|---|---|---|---|
| 5,874,760 A * | 2/1999 | Burns et al. ............ | 257/315 |
| 5,895,253 A | 4/1999 | Akram | |
| 5,998,251 A | 12/1999 | Wu et al. | |
| 6,030,867 A | 2/2000 | Chien et al. | |
| 6,265,302 B1 | 7/2001 | Lim et al. | |
| 6,344,383 B1 | 2/2002 | Berry et al. | |
| 6,465,370 B1 * | 10/2002 | Schrems et al. ........... | 438/783 |
| 6,548,374 B2 * | 4/2003 | Chung ...................... | 438/424 |

OTHER PUBLICATIONS

"Novel Trench DRAM Cell with a VERtIcal Access Transistor and BuriEd STrap (VERI BEST) for 4Gb/16Gb", U. Gruening et al., IEDM 99-25, 1999.
"Extending Trench DRAM Technology to 0.15 μm Groundrule and Beyond", T. Rupp et al., IEDM 99-33, 1999.
"A 0.135 μm² 6F² Trench-Sidewall Vertical Device Cell for 4Gb/16Gb DRAM", C. J. Radens et al., 2000 Symposium on VLSI Technology Digest of Technical Papers, pp. 80-81, IEEE, 2000.

* cited by examiner

*Primary Examiner*—Nathan J. Flynn
*Assistant Examiner*—Fazli Erdem
(74) *Attorney, Agent, or Firm*—DeLio & Peterson, LLC; Kelly M. Nowak; Lisa U. Jacklitsch

(57) ABSTRACT

A self-aligned shallow trench isolation region for a memory cell array is formed by etching a plurality of vertical deep trenches in a substrate and coating the trenches with an oxidation barrier layer. The oxidation barrier layer is recessed in portions of the trenches to expose portions of the substrate in the trenches. The exposed portions of the substrate are merged by oxidization into thermal oxide regions to form the self-aligned shallow trench isolation structure which isolates adjacent portions of substrate material. The merged oxide regions are self-aligned as they automatically align to the edges of the deep trenches when merged together to define the location of the isolation region within the memory cell array during IC fabrication. The instant self-aligned shallow trench isolation structure avoids the need for an isolation mask to separate or isolate the plurality of trenches within adjacent active area rows on a single substrate.

18 Claims, 10 Drawing Sheets

SELF-ALIGNED STI FOR NARROW TRENCHES

BACKGROUND OF THE INVENTION

1. Field of the Invention

This invention relates to the manufacture of semiconductor devices, in particular, dynamic random access memories having self-aligned shallow trench isolation regions for isolating various transistors within a memory array.

2. Description of Related Art

In fabricating integrated circuits (ICs), the IC usually requires that individual active and passive circuit elements be electrically isolated from each other in a common semiconductor chip so that desired circuit connections may be made by patterned surface metallization with which the isolated circuit elements are in contact. Typically, a memory cell in an array of cells isolates the active circuit element from the passive circuit element, and itself must be isolated from adjacent cells and circuit elements. In addition to the memory cell array, many diverse techniques have been proposed over the years to electrically isolate the active and passive circuit elements including lithographic masking levels, junction isolation, dielectric isolation, and combinations thereof.

As the integration density of a Dynamic Random Access Memory (DRAM) steadily increases, including those having vertical trench capacitors, it becomes necessary to reduce the memory cell array size. In the fabrication of DRAMs, the memory cell size, or isolation region, is primarily determined by the minimum resolution dimension of a lithographic masking technique, the overlay tolerances between the different features of the memory cell size, and the layout of such features, while still maintaining the minimum required storage capacitance to reliably operate the DRAM. However, as the conventional integrated circuit DRAM cells are scaled to decreasingly smaller dimensions with advanced generations of memory products, the integration density of the memory array is increased, and as such, in order to meet the cell size and storage capacitance requirements, the associated process technology complexity of the DRAM cells increases, as well as the costs required to produce such modern high density memory arrays.

As IC dimensions get smaller and device densities increase, it becomes more difficult to efficiently and reliably isolate the active and passive circuit elements of the IC, as well as do so at a decreased cost. Prior art is aimed at using lithographic masking levels for isolating the active and passive circuit elements; however, the inclusion of lithographic masking levels in the fabrication of ICs introduces a variety of problems including processing complexities and fabrication errors, which may lead to inefficient and unreliable ICs, in turn leading to increased production costs. Thus, a need exists in the art to reduce the number of lithographic masking levels required for IC processing, thereby reducing the processing costs and complexity of the resultant chip.

Bearing in mind the problems and deficiencies of the prior art, it is therefore an object of the present invention to provide a method and assembly for eliminating conventional lithographic masking levels used to delineate the isolation region within a memory cell array during IC fabrication by forming a self-aligned shallow trench isolation structure in an IC array, preferably in a DRAM array.

Another object of the present invention is to provide a method and assembly for eliminating a fine feature size lithographic masking level in an array.

It is another object of the present invention to provide a method and assembly for reducing the complexity of the high-density memory product.

A further object of the invention is to provide a method and assembly for reducing fabrication costs in high-density memory products.

It is yet another object of the present invention to provide an efficient and reliable isolation process to isolate the smaller active and passive circuit elements of modern ICs.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming an isolation in a semiconductor substrate comprising providing a semiconductor substrate, forming a plurality of adjacent trenches, preferably vertical deep trenches, in the semiconductor substrate leaving adjacent segments of the semiconductor substrate between each of the adjacent trenches, and depositing a barrier layer in the plurality of adjacent trenches. Subsequently a portion of the barrier layer in each of the plurality of adjacent trenches is removed to expose portions of the adjacent segments of the semiconductor substrate, and such exposed portions of the adjacent segments of the semiconductor substrate are merged together to form a self-aligned shallow trench isolation.

Preferably, the semiconductor substrate is a silicon substrate having a pad dielectric layer thereover a surface of the silicon substrate. More preferably, the semiconductor substrate is a silicon substrate having a pad dielectric layer comprising a pad oxide layer followed by a pad nitride layer thereover the surface of the silicon substrate. The pad oxide layer may be provided to a thickness ranging from about 1 to about 10 nm, while the pad nitride may be provided to a thickness ranging from about 50 to about 500 nm. In such an embodiment, the plurality of trenches formed in the substrate traverse through the pad oxide and pad nitride layers, stopping at a distance within the silicon substrate. Preferably the plurality of trenches are etched to a depth ranging from about 250 nm to about 10 µm.

The barrier layer provided within the plurality of adjacent trenches may comprise an oxidation barrier layer. Preferably, the oxidation barrier layer is conformally deposited to at least coat the sidewalls and bottom surfaces of the plurality of trenches, more preferably to a thickness ranging from about 3 nm to about 30 nm. Subsequently a portion of the oxidation barrier layer within the plurality of trenches is recessed thereby exposing the portions of silicon substrate in a top portion of the plurality of trenches.

Preferably, the portions of the oxidation barrier layer are recessed by depositing a photoresist within remaining portions of the plurality of trenches having the oxidation barrier layer to at least fill such empty portions. A desired depth in the photoresist is then determined for recessing the oxidation barrier layer, preferably to a depth ranging from about 20 nm to about 2000 nm. Subsequently, the photoresist and the oxidation barrier layer within the plurality of trenches are etched stopping at the desired depth in the photoresist thereby recessing the oxidation barrier layer to the desired depth and exposing the portions of the adjacent segments of silicon substrate in a top portion of the plurality of adjacent trenches. Any remaining photoresist may then be removed.

Preferably, the exposed portions of the adjacent segments of the silicon substrate are then etched to form a plurality of thin sections of the exposed adjacent segments of the silicon substrate between each of the plurality of adjacent trenches. Preferably, the exposed portions of silicon substrate are etched using an etchant which selectively removes only the silicon substrate to form the plurality of thin sections of the exposed adjacent segments of the silicon substrate, including an etchant selected from the group consisting of a chlorine-containing etchant, KOH, and $NH_4OH$. Preferably, the thin sections of the exposed adjacent segments of the silicon substrate between each of the plurality of adjacent trenches have a diameter ranging from about ⅕ to about ½ that of an original diameter of the exposed portions of the adjacent segments of the silicon substrate.

The plurality of thin sections of the exposed adjacent segments of the silicon substrate between each of the plurality of adjacent trenches are then merged together to form a self-aligned thermal oxide shallow trench isolation structure. Preferably, the self-aligned thermal oxide shallow trench isolation structure is formed by merging together the thin exposed portions of the semiconductor substrate, between vertical adjacent trenches, at least along a first row of selected ones of the plurality of trenches. More preferably, the self-aligned thermal oxide shallow trench isolation structure is formed by converting the thin portions of silicon substrate between adjacent trenches within the at least one row into the thermal oxide region by oxidation, such as by LOCOS, thereby forming a self-aligned silicon dioxide shallow trench isolation. Thus, the self-aligned thermal oxide shallow trench isolation structure of the instant invention isolates a first region of the semiconductor substrate on a first side of the at least one set of merged adjacent trenches from a second region of the semiconductor substrate on a second side of the at least one set of merged adjacent trenches.

After the merged self-aligned thermal oxide shallow trench isolation structure has been formed, remaining portions of the barrier layer in the plurality of adjacent trenches may be removed, a deep trench capacitor formed in each of the adjacent trenches, and subsequently a vertical transistor formed within the adjacent trenches to form a memory cell.

In another aspect, the present invention provides a self-aligned isolation structure in a semiconductor substrate comprising a semiconductor substrate, preferably a silicon substrate, having a plurality of adjacent trenches in the semiconductor substrate, and a self-aligned isolation structure in upper portions of selected ones of the plurality of trenches. The self-aligned isolation structure in the upper portions of selected ones of the plurality of trenches is merged portions of the semiconductor substrate along at least a first row of the selected ones of the plurality of adjacent trenches and is aligned as-formed to edges of the plurality of adjacent trenches. The self-aligned isolation structure isolates a first region of the semiconductor substrate from a second region of the semiconductor substrate.

In the present invention, the semiconductor substrate has a pad dielectric layer thereover a surface of the semiconductor substrate, preferably the pad dielectric layer comprises a pad oxide layer having a thickness ranging from about 1 to about 10 nm followed by a pad nitride layer having a thickness ranging from about 50 nm to about 500 nm. The plurality of trenches in the semiconductor substrate may have depths ranging from about 250 nm to about 10 μm.

The isolation structure preferably comprises a thermal oxide region existing along the at least one row of selected ones of the plurality of trenches in upper portions of the semiconductor substrate. Preferably, wherein the semiconductor substrate comprises a silicon substrate, the thermal oxide region comprises a thermal silicon dioxide region existing along the at least one row of selected ones of the plurality of trenches in upper portions of the semiconductor substrate. In the present invention, the merged thermal oxide isolation structure along the at least one row of selected ones of the plurality of trenches in upper portions of the semiconductor substrate isolates a first region of the semiconductor substrate from a second region of the semiconductor substrate with the at least one row merged trenches.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 9–15 illustrate the steps of forming a deep trench capacitor and a vertical transistor in the silicon substrate having the merged thermal oxide regions, as shown in FIGS. 5–8, in particular:

FIG. 9 is a partial cross-sectional view along dashed line 101 of FIG. 7 showing forming a deep trench capacitor within the trenches of the silicon substrate of FIGS. 5–8 by providing an isolation collar on the exterior of the deep trenches and setting a desired channel length within the trenches for the vertical transistor.

FIG. 10 is a partial cross-sectional view of FIG. 9 showing portions of the isolation oxide 30 and isolation collar 220 removed from regions of the trench sidewalls for forming a buried strap connection between the capacitor and the transistor.

FIG. 11 is a partial cross-sectional view of FIG. 10 showing the buried strap connection having a trench-top oxide provided thereover the substrate and a transistor gate dielectric in the trenches, along a sidewall of the upper region of the trench, thereby being in direct contact with the exposed portions of the substrate.

FIG. 12 is a partial cross-sectional view of FIG. 11 showing remaining empty portions of the trenches filled with a trench gate electrode material.

FIG. 14 is a partial cross-sectional view of FIG. 13B showing the completed memory cell structure of the preferred embodiment of the present invention.

FIG. 15 is a partial cross-sectional view of FIG. 14 along dashed line 202 of FIG. 13B.

DESCRIPTION OF THE PREFERRED EMBODIMENT(S)

Figure 1A:
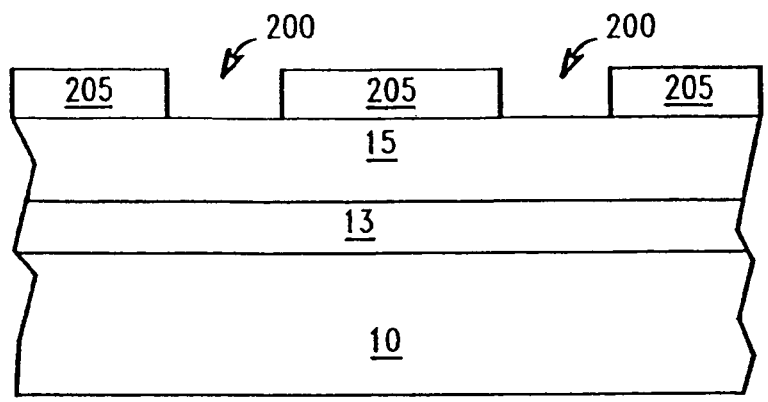
FIG. 1A is a partial cross-sectional view of a preferred embodiment of the present invention showing a substrate having a pad oxide layer thereover followed by a pad nitride layer, and a masking pattern thereover the pad nitride layer for forming a plurality of deep trenches.

In describing the preferred embodiment of the present invention, reference will be made herein to FIGS. 1–16 of the drawings in which like numerals refer to like features of the invention. Features of the invention are not necessarily shown to scale in the drawings.

FIGS. 1A to 16 show a preferred embodiment of the present invention. In FIG. 1A, a semiconductor substrate 10 has a pad dielectric layer provided thereon comprising a pad oxide layer 13, preferably silicon oxide, followed by a pad nitride layer 15, preferably silicon nitride. In the preferred embodiment, the pad oxide layer 13 and pad nitride layer 15 are both provided directly over the substrate 10 by techniques as known and used in the art. Preferably, the silicon oxide layer 13 is provided thereover the substrate 10 by thermal oxidation to a thickness ranging from about 1 nm to about 10 nm, followed by the pad nitride layer 15 comprising silicon nitride deposited by chemical vapor deposition (CVD) to a thickness ranging from about 50 to about 500 nm. The semiconductor substrate 10 may comprise silicon, silicon on insulator (SOI), or alternatively any other semiconductor material as known and used in the art including GaAs, InP, and the like. Further, the semiconductor substrate 10 may preferably be provided with a memory cell capacitor in a subsequent step including a DRAM, EDRAM, or other related structures as will be recognized in the art.

Figure 1B:
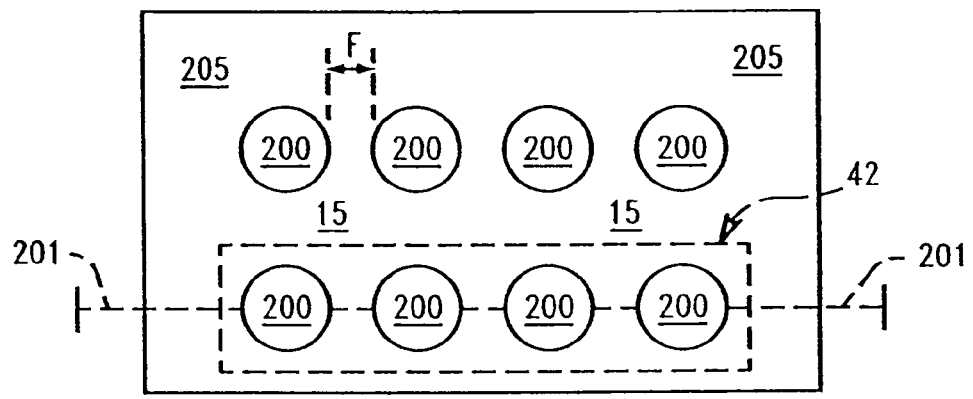
FIG. 1B is a top plane view of the masking pattern of FIG. 1A used to form the deep trenches of the present invention.

Subsequently, the substrate 10, pad oxide layer 13 and pad nitride layer 15 are patterned using conventional lithographic and dry etch pattern techniques as known and used in the art. For example, the surface of the pad nitride layer 15 may be provided with a masking film 205 and subsequently patterned using pattern 200 as illustrated in FIGS. 1A–B by techniques as known and used in the art including photolithography, dry etch, and the like. As further illustrated in FIG. 1A, pattern 200 forms an array of openings, such as a capacitor pattern in a conventional DRAM, whereby "F" refers to the minimum lithographic feature size. Subsequently, the pattern 200 is etched to form a plurality of deep trenches 18 traversing through the pad nitride layer 15, pad oxide layer 13, and substrate 10, whereby a set of the plurality of deep trenches 18 forms a path of deep trenches 42 as illustrated by dashed line 201 of FIG. 1B. In the present invention, the substrate may be provided with a plurality of adjacent paths of trenches 42 as indicated by the adjacent active area rows 45 of FIG. 5.

In the preferred embodiment of the present invention, the formed pattern, such as pattern 200, is etched to form the plurality of deep trenches 18 traversing through the pad nitride layer 15, pad oxide layer 13, and substrate 10 to a depth ranging from about 250 nm to about 10 μm, preferably to about 6 μm. See FIG. 1C. The substrate may be patterned and etched by techniques as known and used in the art including photolithography, dry etch process, and the like. As will be recognized by one skilled in the art, in the process of making semiconductor memory devices, such as DRAMs, EDRAMs, and the like, the deep trenches 18 are formed in the silicon substrate in a direction vertical to the planar surface of the substrate 10, thus forming perpendicular walls with the substrate surface. See FIG. 1C. As illustrated in the partial cross sectional view of the deep trenches in FIG. 1C, the vertical deep trenches 18 have side walls 22 perpendicular with the substrate surface and a bottom surface 24 parallel with the substrate surface. The memory cell capacitors, including DRAM and EDRAM, may be formed on the side walls 22 within deep trenches 18.

Figure 1C:
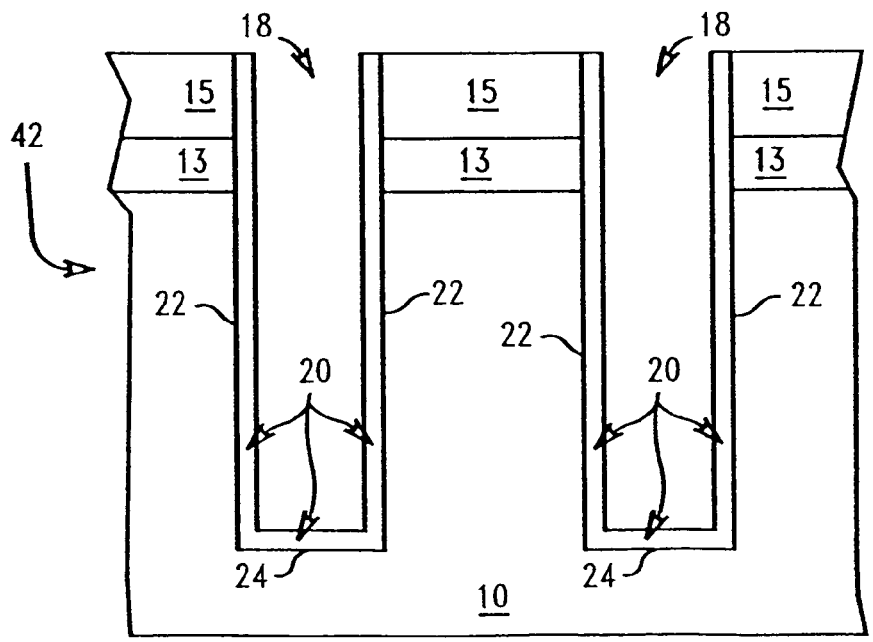
FIG. 1C is a partial cross-sectional view of a preferred embodiment of the present invention along a single row of trenches showing a silicon semiconductor substrate having the plurality of trenches etched into the silicon substrate using the pattern of FIGS. 1A–B with a conformal oxidation barrier layer deposited therein.

As further illustrated in FIG. 1C, after forming the deep trenches 18, a thin insulation barrier layer 20 is conformally provided within trenches 18 to at least cover the side walls 22 and the bottom surface 24 of the trenches. Preferably, the insulation barrier layer comprises an oxidation barrier layer 20 comprising a local oxidation of silicon (LOCOS), silicon nitride, silicon oxynitride, and the like, deposited using techniques and apparatus as known and used in the art including, for example, low pressure chemical vapor deposition (LPCVD) and direct nitridation of the silicon surface. In the present invention, the oxidation barrier layer 20 may be provided to a thickness ranging from about 2 nm to about 50 nm. Alternatively, the oxidation barrier layer 20 may be deposited to a thickness to at least conformally coat the side walls 22 and bottom 24 of the deep trenches 18. Preferably, the thin insulation barrier layer comprising the oxidation barrier layer 20 comprises silicon nitride deposited by low pressure chemical vapor deposition (LPCVD) to a thickness ranging from about 3 nm to about 30 nm. More preferably, the oxidation barrier layer 20 comprises a silicon nitride layer 20 deposited by LPCVD, to a thickness of about 15 nm.

Figure 2:
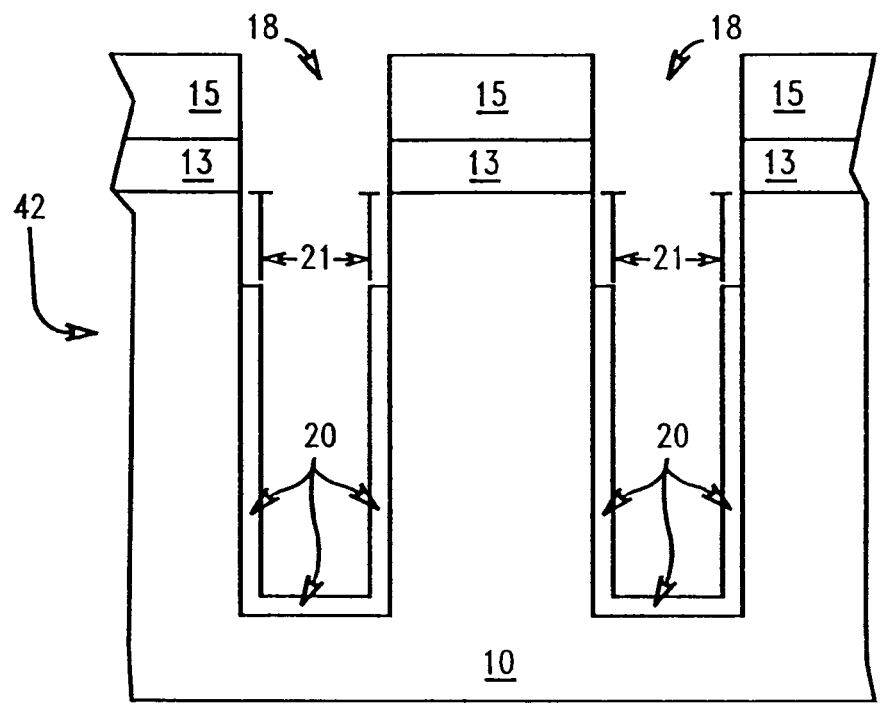
FIG. 2 is a partial cross-sectional view of the silicon substrate of FIG. 1 having a portion of the conformal oxidation barrier layer recessed thereby exposing upper portions of the silicon substrate within the trenches.

Subsequently, as illustrated in FIG. 2, a portion of the oxidation barrier layer 20 is recessed or removed to expose adjacent portions of the pad oxide 13 and pad nitride 15 layers, as well as portions of the silicon substrate 10 within an upper portion of the deep trenches 18. As shown in FIG. 2, preferably the oxidation barrier layer 20 is recessed at a top portion in trench 18, thereby exposing the top portion of the silicon substrate 10 within trenches 18. In the preferred embodiment, the oxidation barrier layer 20 is removed or recessed by depositing a photoresist layer within trenches 18 to at least fill trench 18. After depositing the photoresist layer within trenches 18, the photoresist and the oxidation barrier layer are recessed to a selected or desired depth by techniques as known and used in the art such as, chemical dry etching (CDE), and the like. Alternatively, the barrier layer 20 may be recessed using conventional sacrificial materials as known and used in the art including polysilicon, doped glass, and the like. The oxidation barrier layer 20 may be recessed to a depth ranging from about 20 nm to about 2000 nm. Preferably the oxidation barrier layer 20 is recessed to a depth of about 600 nm. In recessing the oxidation barrier layer 20 to the selected or desired depth, portions of the oxidation barrier layer 20 remain in lower portions of the deep trenches 18 for protecting any remaining portions of the silicon substrate 10 in the deep trenches 18 during subsequent processing steps. See FIG. 2. In protecting the remaining portions of the silicon substrate 10 in the deep trenches 18, the remaining oxidation barrier layer 20 in the lower regions of trenches 18 prevents oxidation of the corresponding portions of the silicon substrate 10 directly underlying such remaining oxidation barrier layer in the lower portions of the trenches.

As illustrated in FIG. 2, by recessing the oxidation barrier layer 20 to the desired or selected depth, upper portions 21 of the silicon substrate 10 are exposed within trench 18 above the remaining portions of the oxidation barrier layer 20 on the sidewalls 22 of the trenches. In the preferred embodiment, after the oxidation barrier layer of silicon nitride has been etched to expose portions 21 of the silicon substrate 10, the photoresist may then be removed from the trenches 18 using conventional techniques as known and used in the art including resist stripping, wet cleaning, and the like. In the alternate embodiment wherein the barrier layer 20 is recessed using conventional sacrificial materials, any remaining sacrificial material may be removed from the trenches by, for example, isotropic etching.

Figure 3:
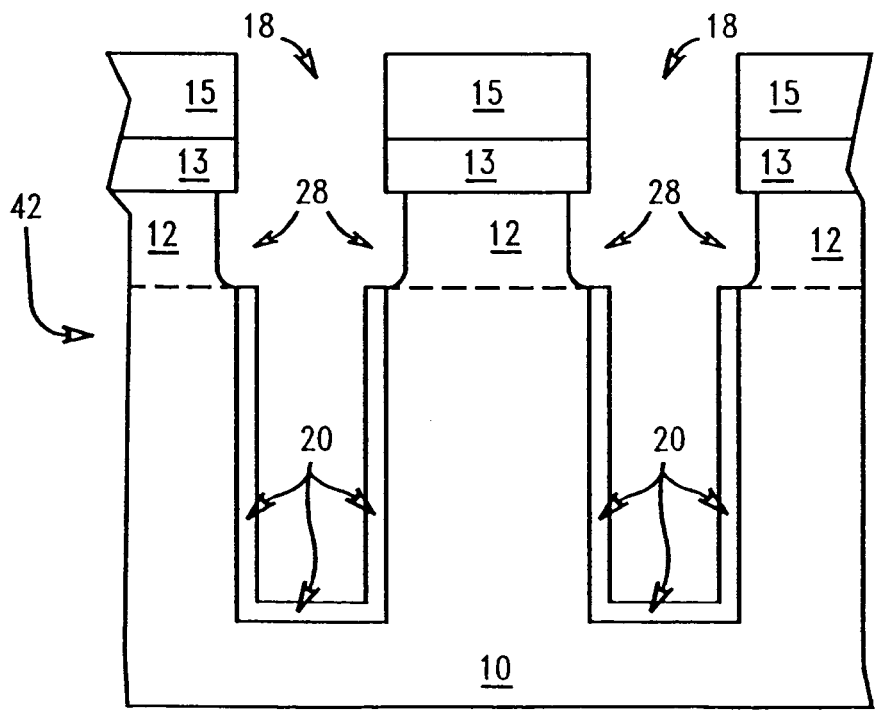
FIG. 3 is a partial cross-sectional view of the silicon substrate of FIG. 2 illustrating the step of forming thin silicon substrate portions between adjacent trenches for forming the merged oxidation isolation regions of the present invention.

As illustrated in FIG. 3, subsequently the exposed portions 21 of the silicon substrate 10 within trenches 18 are etched to provide thin silicon substrate portions 12 between adjacent trenches 18 for the purpose of merging oxidation fronts of the substrate to form a self-aligned shallow trench isolation structure in subsequent oxidation processing steps. Preferably, the thin silicon substrate portions 12 are provided with a diameter of about ⅕ to about ½, more preferably a diameter of about ⅓, the original diameter of the exposed portions 21 of the silicon substrate 10. In etching the exposed portions 21 of the silicon substrate to provide the thin silicon substrate portions 12, the empty area of upper regions 28 of the exposed portions is simultaneously increased in diameter. In the present invention, the exposed portions 21 of the silicon substrate 10 may be etched by techniques as known and used in the art including isotropically etching the substrate using a chlorine-containing wet or dry etch, or alternatively an anisotropic etch including a KOH or $NH_4OH$ based wet solution. The exposed portions 21 of the silicon substrate are etched using an etchant which removes silicon selective to the nitride and oxide layers. As illustrated in FIG. 3, preferably the etchant selectively recesses only the exposed portions 21 of the silicon substrate 10 in the empty area of upper regions 28 of the trenches 18 thereby increasing in diameter only the exposed portions 21 of the silicon substrate 10.

In the preferred embodiment, in etching the exposed portions 21 of the silicon substrate, the silicon substrate at the exposed portions 21 is etched stopping at a timed etch using an etchant selective to the nitride layer 20 and pad 15, thereby leaving the remaining thin portions of silicon substrate 12 between adjacent trenches 18. During etching of the exposed portions 21, the remaining silicon nitride layer 20 is not recessed, thereby protecting any underlying silicon substrate 10. The timed etch for increasing in diameter the exposed portions 21 of the silicon substrate 10 may comprise the isotropic wet or dry etchants, Cl-based, KOH, or $NH_4OH$ as discussed above. In an alternate embodiment, the exposed portions 21 of the silicon substrate 10 within trenches 18 may not be required to be increased in diameter to provide the thin silicon substrate portions between adjacent trenches. In such an embodiment, the thin silicon substrate portions 12, between adjacent trenches 18, may be at a thickness sufficient to allow merging of the oxidation fronts immediately after recessing the oxidation barrier layer 20 to provide the exposed portions 21, thereby avoiding the need to increase the diameter of the upper regions 28 to provide the thin silicon substrate portions 12. In the preferred embodiment, the etching of the exposed portions 21 of the silicon substrate 10 recesses the exposed portions of silicon substrate to leave the thin portions of silicon substrate 12 between adjacent trenches 18 for subsequent oxidation merging. See FIG. 3.

Figure 4:
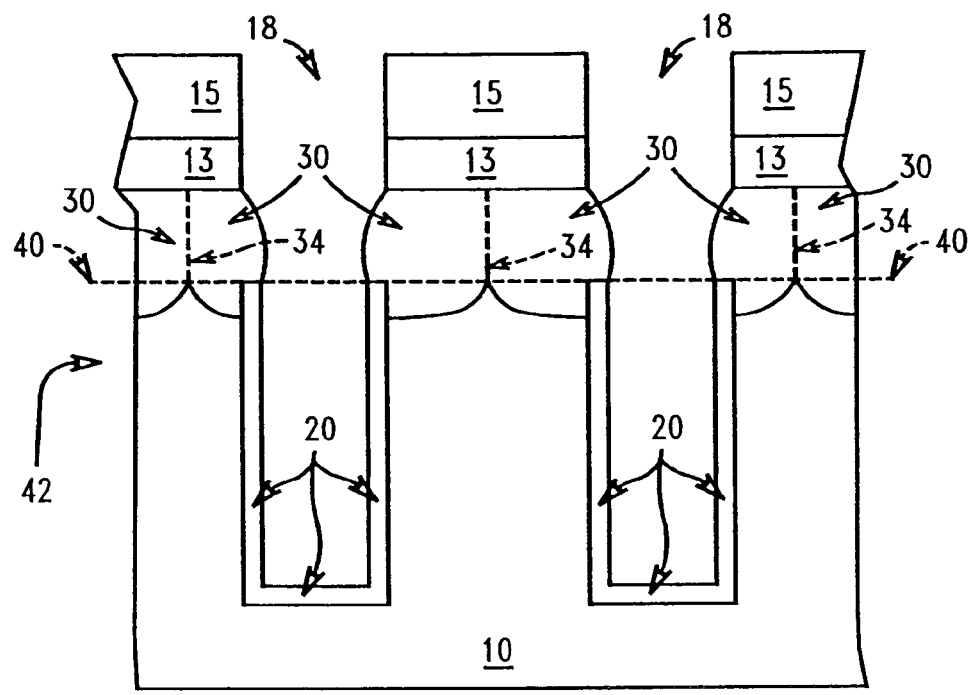
FIG. 4 is a partial cross-sectional view of the silicon substrate of FIG. 3 illustrating the step of forming a self-aligned shallow trench isolation structure by merging the thin silicon substrate portions between adjacent trenches of FIG. 3 by converting such thin silicon substrate portions to merged thermal oxide silicon portions by oxidation.
Figure 5:
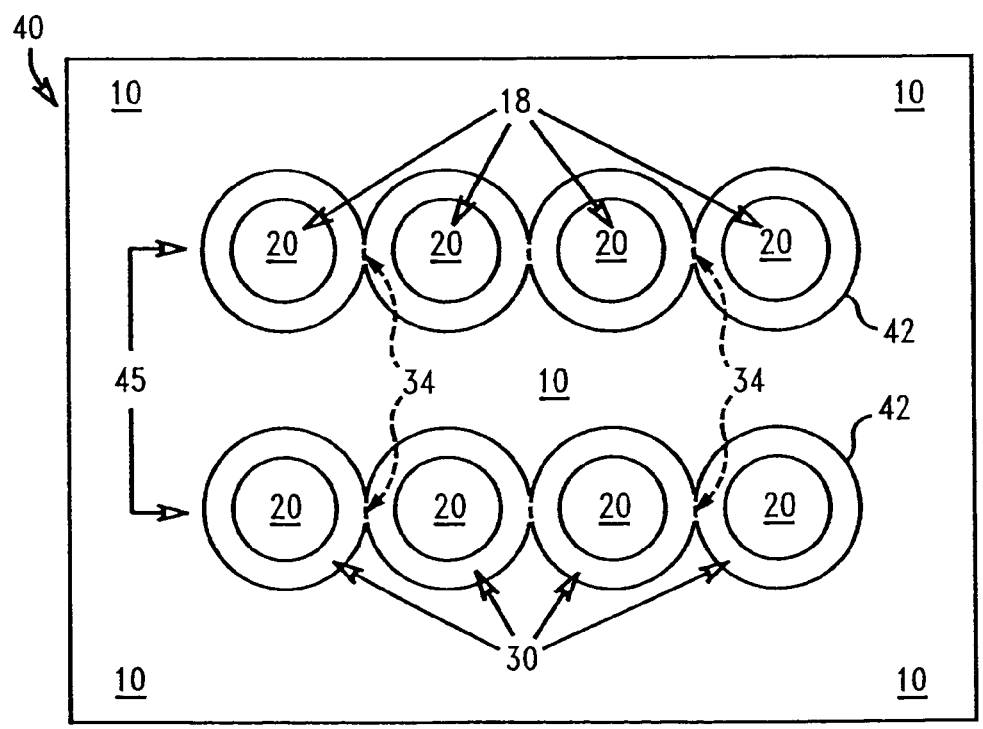
FIG. 5 is a partial top plane view of the silicon substrate across dashed line 40 in FIG. 4, after the thin silicon substrate portions have been oxidized to form the merged thermal oxide regions.

Adjacent thin portions of silicon substrate 12 along a path of trenches 42 are subsequently merged together by oxidation to form self-aligned, shallow thermal oxide regions 30 comprising the self-aligned shallow trench isolation structure of the present invention which isolates adjacent active area rows 45 of adjacent paths of trenches 42 on a single substrate, such as adjacent first and second active area rows 45 whereby each first and second active area rows 45 comprises a separate, distinct path of trenches 42. See FIGS. 4 and 5. The thin, self-aligned, shallow thermal oxide regions 30 are formed by thermal oxidation which merges together the thin oxidized regions of silicon substrate 12 between adjacent trenches 18 along a row or path of trenches 42. The merged, self-aligned thermal oxide regions 30 forming the self-aligned shallow trench isolation structure of the present invention eliminates the need for an isolation mask to separate or isolate adjacent active area rows 45 of adjacent paths of trenches 42 on a single substrate as illustrated in FIG. 5. In forming the present self-aligned shallow trench isolation structure the thin oxidized regions of silicon substrate 12 are merged together by oxidation to form the merged thermal oxide regions 30, or the self-aligned shallow trench isolation structure, thereby being automatically aligned to the as-formed, original outer edges of the deep trenches 18. As further detailed, FIG. 4 is a partial cross-sectional view along a single path of trenches 42 showing the merged thermal oxide regions 30, or the self-aligned shallow trench isolation structure of the present invention. Dashed lines 34 of FIG. 4 are for illustration purposes to show that the oxidized adjacent thin silicon regions, along the single path of trenches 42, merge together to form a continuous, thermal oxide region 30, or the self-aligned shallow trench isolation structure, along the single row of trenches 42. Thus, the present invention provides a self-aligned shallow trench isolation structure which automatically and simultaneously merges and aligns each path of trenches 42 on a substrate, whereby the substrate may have a plurality of adjacent rows 45 of paths of trenches 42, while simultaneously separating or isolating each adjacent active area row 45 of adjacent paths of trenches 42 from each other on the single substrate. See FIG. 5.

In accordance with the present invention, in forming the self-aligned shallow trench isolation structure the thin portions of silicon substrate 12 may be oxidized preferably by a local oxidation of silicon (LOCOS) process as known and used in the art thereby converting the thin adjacent silicon substrate portions 12 existing between adjacent trenches 18 into thin, merged, shallow self-aligning thermal silicon dioxide ($SiO_2$) regions 30 existing along a path of adjacent trenches 18 in a row of trenches 42. See FIGS. 4 and 5. As illustrated in FIG. 4, the LOCOS process preferably grows only in the upper regions 28 of the trenches 18 whereby only the thin portions of silicon substrate 12 are oxidized for conversion and merged into the thin, self-aligned thermal oxide regions 30, as illustrated along dashed line 34. During conversion of the silicon substrate portions 12 into the merged thermal oxide regions 30, portions of the oxidation barrier layer 20 in the lower portions of the trenches protect any substrate material 10 in the lower portions of the trenches 18 from oxidation, while the pad nitride 15 layers on the substrate surface also serve as an oxidation barrier to localize the LOCOS process to form thermal oxide regions 30 only in the upper regions 28 of the trenches 18. See FIG. 4. Thus, the substrate 10 having the plurality of adjacent trenches 18 has the nitride barrier layer 20 protecting substrate material only in a lower portion of the trenches 18 and the merged thermal oxide regions 30 only in upper regions of the trenches 18 in a horizontal cut plane.

FIG. 5 illustrates the merged thermal oxide regions 30 from a top plane view of a partial horizontal cross-sectional view of the cut plane indicated by the dashed line 40 in FIG. 4. As shown in FIG. 5, the thermal oxide regions 30 merge together, as indicated by dashed lines 34, along adjacent trenches 18 along selected orientations of single paths or rows of trenches 42 to provide the continuous self-aligned shallow trench isolation structure which eliminates the need for an isolation mask to separate adjacent rows of trenches 42. In the preferred embodiment, as illustrated in FIG. 5, the trenches 18 within a single row 42 are closer to each other in comparison to trenches along the adjacent active area rows 45. Furthermore, as depicted by dashed line 34 in FIGS. 4 and 5 illustrating the merged, self-aligned thermal oxide regions 30 of a single row of trenches 42, the merged self-aligning thermal oxide isolation regions 30 merge together both vertically and horizontally to provide the continuous, merged, self-aligned thermal oxide region 30 which surrounds each trench 18 of the plurality of trenches along each path of trenches 42 on the substrate.

Further as shown in FIG. 5, remaining portions of silicon substrate 10, which were not oxidized during the process of converting the thin silicon portions 12 into the merged self-aligning thermal oxide isolation regions 30, exist between the adjacent active area rows 45 on the substrate 10. The remaining portions of silicon substrate 10 provides a continuous region of silicon substrate 10 between the adjacent active area rows 45, thereby providing electrically continuous regions of silicon substrate between such adjacent active area rows 45 in which transistors may subsequently be formed by techniques as known and used in the art. See FIG. 5. Therefore in the present invention, the self-aligned, merged thermal oxide regions 30 electrically isolate a current between adjacent rows of silicon substrate 10 existing between the adjacent active area rows 45, without requiring the additional processing steps, such as isolation masks, needed to separate the adjacent active area rows 45. In the preferred embodiment, the continuous, merged self-aligned thermal oxide regions 30 along paths of trenches 42 isolate, or block electrical conduction between adjacent rows of silicon substrate 10 existing therebetween the adjacent active rows 45.

Thus, the present invention provides a self-aligned shallow trench isolation structure by converting the thin regions of silicon substrate 12 between adjacent trenches into thin oxidized, merged regions of silicon substrate for isolating various transistors within a memory array automatically thereby aligning and defining the location of the isolation region. In the present invention, the thin thermal silicon dioxide regions 30 are self-aligned, as-formed, as a result of the thin silicon substrate portions 12 being simultaneously oxidized and merged between adjacent trenches along a path of trenches 42 in the same process to automatically align edges of the thin thermal silicon dioxide regions 30 to the as-formed, original outer edges of the deep trenches 18. Thus, the edges of the thin thermal silicon dioxide regions 30 directly contact the as-formed, original outer edges of the deep trenches 18 to fill any gaps between the thin thermal silicon dioxide regions and the trenches 18. As such, the present invention eliminates the need for additional masking processes for defining the location of the isolation region.

Figure 6:
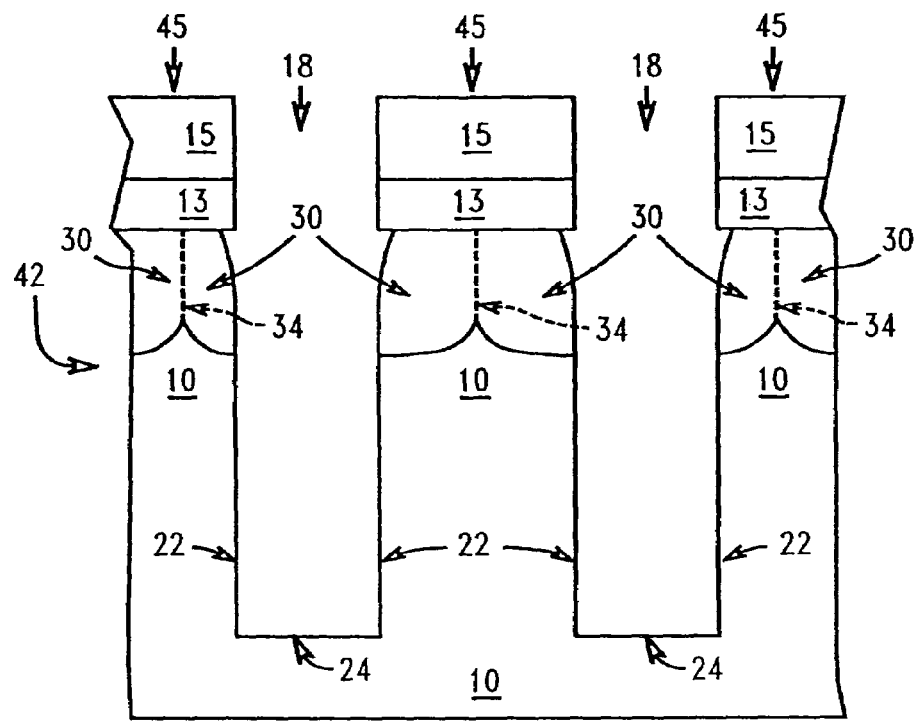
FIG. 6 is a partial cross-sectional view of the silicon substrate of FIG. 4 having the merged thermal oxide regions illustrating the step of removing any remaining barrier layer within the trenches for forming a vertical transistor within the trenches.
Figure 7:
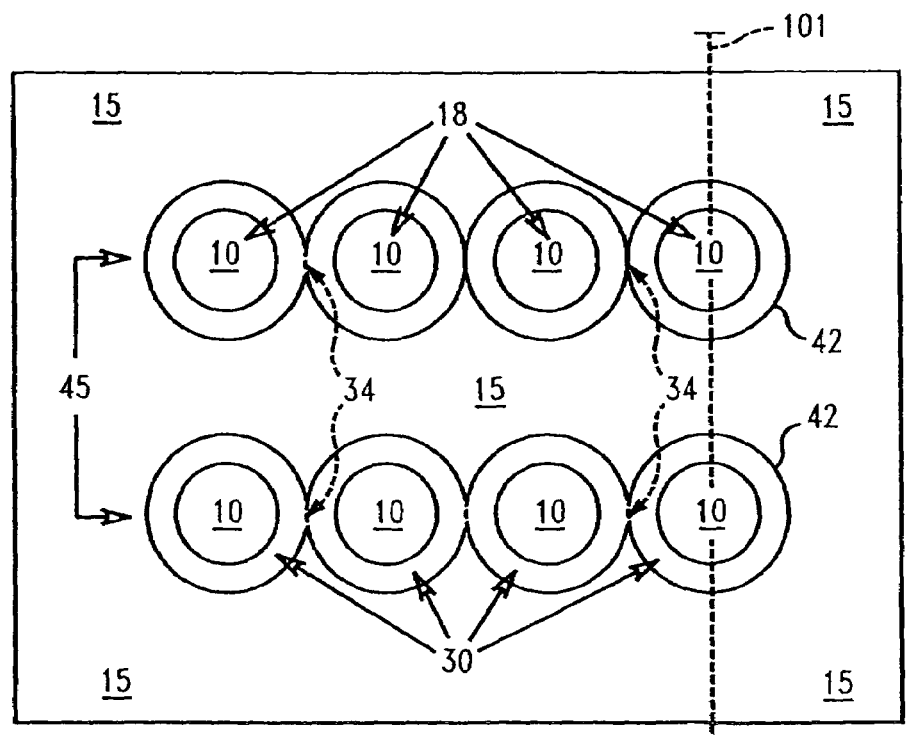
FIG. 7 is a partial top plane view of the substrate of FIG. 6, after the remaining oxidation barrier layer has been removed from the trenches.

Subsequently, the remaining oxidation barrier layer 20 within trenches 18 is removed by techniques as known and used in the art such as, for example, etching using etchants which allow selective removal of nitride to oxide and silicon including wet phosphoric acid, and the like. See FIG. 6. In the preferred embodiment, the remaining oxidation barrier layer 20 comprising silicon nitride is removed by an isotropic wet etch using a phosphoric acid solution thereby removing the remaining silicon nitride layer 20 for subsequent vertical transistor formation. FIG. 7 illustrates a partial cross sectional top plane view of FIG. 6, after the remaining oxidation barrier layer 20 has been removed from the trenches 18. As shown in FIG. 7, the substrate comprises the plurality of deep trenches 18 having the substrate 10 exposed at the bottom surface 24 of the trenches 18, as well as at the lower portions of the sidewalls 22 of trenches 18. Thereover the exposed substrate portions exists the continuous, merged self-aligned thermal oxide regions 30 followed by portions of the oxide layers 13 and nitride layers 15.

Figure 8:
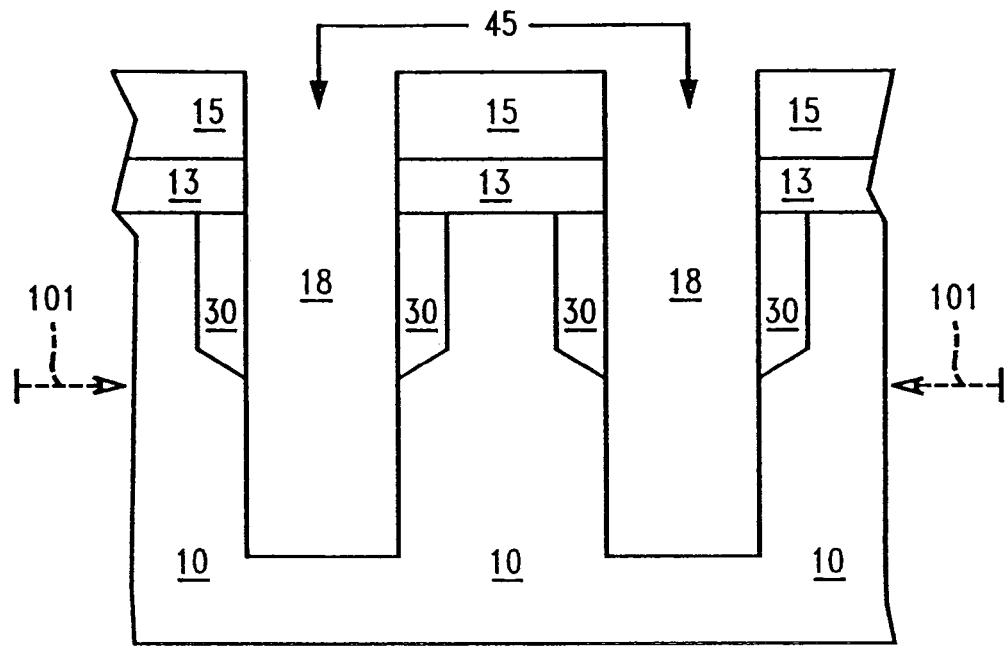
FIG. 8 is a partial cross-sectional view of the silicon substrate having the merged self-aligning silicon regions along dashed line 101 in FIG. 7.

FIG. 8 further illustrates a partial cross sectional view along dashed line 101 of FIG. 7 showing a portion of the substrate, having the adjacent active area rows 45, after the oxidation barrier layer 20 has been removed from the deep trenches 18. As shown, each adjacent active area row 45 is separated, or isolated from each other by portions of the substrate, thereby such portions of the substrate being separated from each other by the adjacent active area row 45.

Subsequently, a deep trench capacitor may be formed within each of the trenches 18, followed by formation of a vertical transistor, as illustrated in FIGS. 9–15. In the present invention, a variety of transistors may be formed in trenches 18 including a MOSFET, JFETs, bipolars, and the like. In the preferred embodiment, a MOSFET is formed within the deep trenches 18 as illustrated in FIGS. 9–15 showing the cross sectional view along dashed lines 101 and 202.

Figure 9:
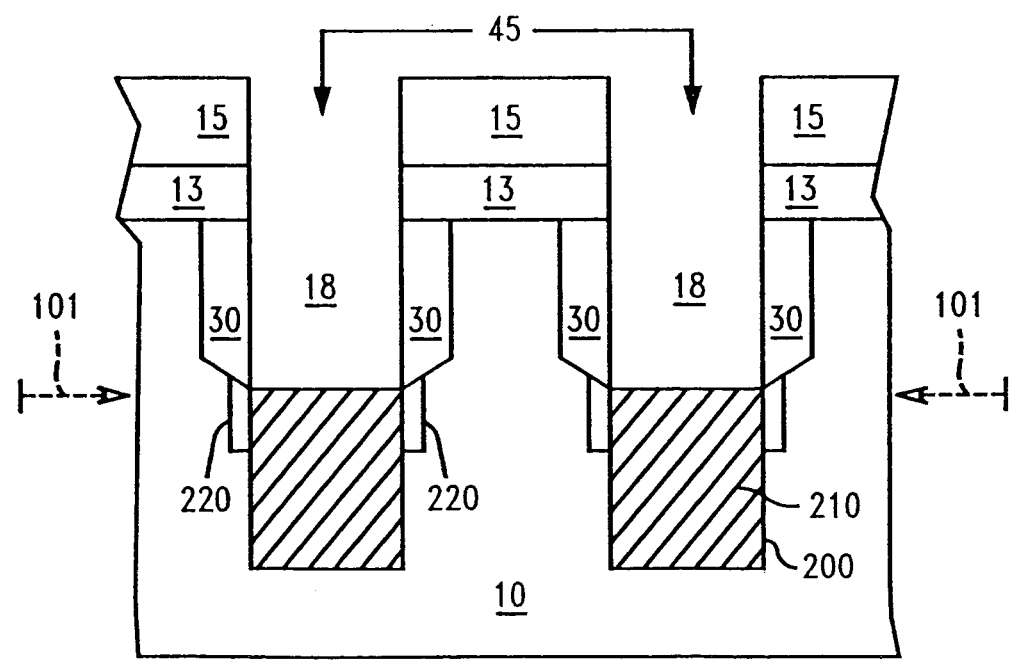

In the present invention, the deep trench capacitor may be provided within the deep trenches 18 by known techniques including, for example, the technique of Rupp, et al., *Extending Trench DRAM Technology to 0.15 μm Groundrule and Beyond*, IEDM Proceedings, page 33–36, 1999, herein incorporated by reference. In forming the deep trench capacitor, the trenches 18 may be provided with a deep trench capacitor comprising a buried plate diffused electrically around the exterior of the deep trenches. As illustrated in the cross sectional view along dashed line 101 of FIG. 7, FIG. 9 illustrates that the deep trench capacitor may be provided within the deep trenches 18 by providing the buried plate comprising an isolation collar 220 diffused electrically around the exterior of the deep trenches. The isolation collar 220 may be provided directly under the self-aligned shallow trench isolation structure comprising the merged thermal silicon dioxide regions 30, thereby making direct contact with the silicon dioxide regions 30 and filling any gaps therebetween. Furthermore, the isolation collar 220 is provided in the upper, external regions of the trench 18 lying there-under the merged thermal silicon dioxide regions 30 by known techniques. The isolation collar 220 may comprise a material as known and used in the art including silicon dioxide, silicon nitride, and the like, and may be provided in such upper, external regions of the trench 18 to a thickness of about 3 nm to about 50 nm. In the preferred embodiment, the isolation collar 220 comprises silicon dioxide provided to a thickness of about 30 nm.

Subsequently, a thin node insulator material 200 is conformally deposited within the deep trenches 18 to coat both sidewalls within the deep trenches as well as the bottom surface of the deep trenches. The thin node insulator material 200 may comprise a dielectric material as known and used in the art, conformally deposited by known techniques to a thickness ranging from about 2 nm to about 10 nm. In the preferred embodiment, the thin node insulator material 200 comprises SiN deposited by LPCVD to a thickness of about 4 nm. Subsequently, a polysilicon filling material is deposited within the deep trenches by known techniques and then recessed by standard dry etching to a desired depth which sets a desired channel length and vertical transistor. In the preferred embodiment, an Arsenic doped n+ type LPCVD silicon 210 is deposited within the trenches and then recessed by dry etching to a depth ranging from about 200 nm to about 500 nm, thereby setting the desired channel length for a vertical transistor.

Subsequently, the vertical transistor may be provided on the sidewalls within each of the deep trenches 18 by techniques as known and used in the art such as, for example, those techniques as disclosed in Gruening, et al., *A Novel Trench DRAM Cell with a VERtIcal Access Transistor and BuriEdStrap (VERI BEST) for 4Gb/16Gb*, IEDM Proceedings, page 25–28, 1999; and Radens, et al., *A 0.135 $\mu m^2$ $6F^2$ Trench-Sidewall Vertical Device Cell for 4Gb/16Gb DRAM*, IEDM Proceedings, page 80–81, 2000.

Figure 10:
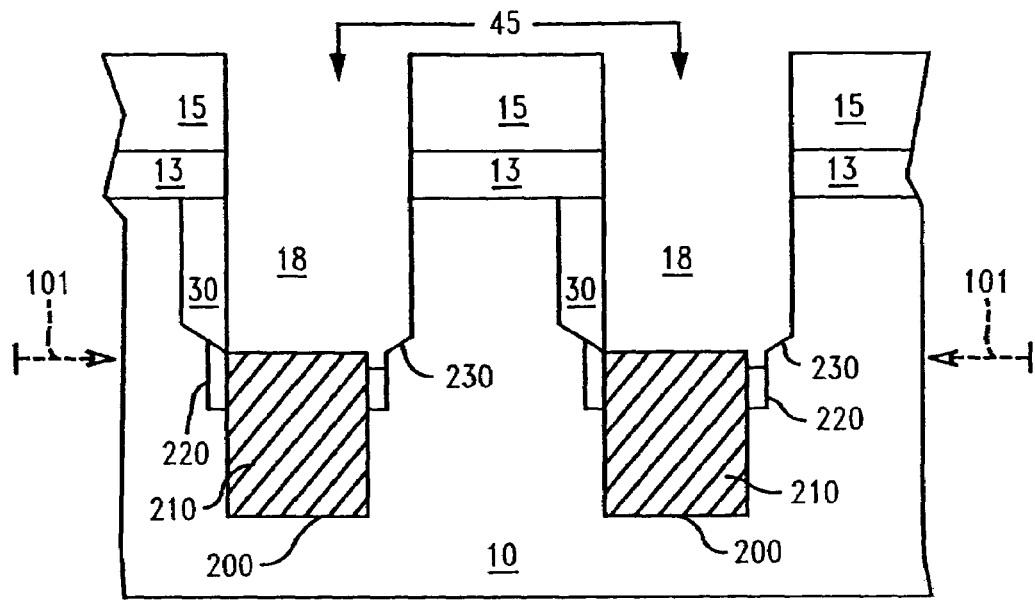

After the desired channel length for the vertical transistor has been set, portions of the trenches 18 may be patterned and removed for forming a buried strap connection 240, such as buried strap source and drain diffusion regions. As illustrated in FIG. 10, the trenches 18 may be patterned by known techniques, for example, by using a lithographic masking step followed by a combination of dry and wet etching processes as described above in Radens et al., whereby a portion of a surface area of the substrate is patterned to provide a masked pattern which is used to remove a portion of the isolation oxide 30 and isolation collar 220 from regions of the trench sidewalls by known techniques. In removing the portions of the isolation oxide 30 and isolation collar 220 using the masked pattern, a divot 230 is formed in an upper portion of the isolation collar 220. The divot 230, formed by the removal of the isolation collar 220, is subsequently filled with a LPCVD silicon material by known techniques to a thickness ranging from about 10 nm to about 50 nm. In the preferred embodiment, the portions of the isolation oxide 30 and isolation collar 220 are removed to form the divot 230 in the upper portion of the isolation collar 220 which is then provided with LPCVD silicon to a thickness of about 30 nm to form the buried strap connection between the capacitor and the transistor. See FIG. 11.

Figure 11:
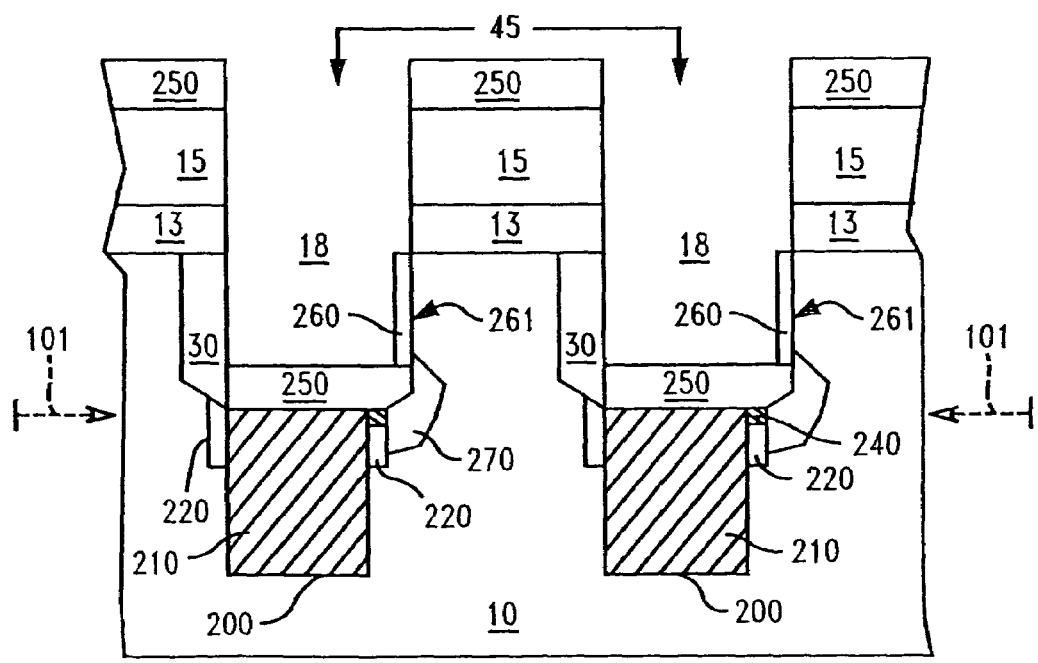

As illustrated in FIG. 11, the buried strap connection 240 is then formed by depositing an LPCVD silicon in the deep trenches to at least fill the divot 230, and subsequently etching back the LPCVD silicon in the divot 230 to a depth corresponding with a top surface of the Arsenic doped n+ type LPCVD silicon 210, thereby providing a planar surface between the buried strap connection 240 directly contacting the Arsenic doped n+ type LPCVD silicon 210. As further illustrated in FIG. 11, an out-diffusion region of n+ impurities from the Arsenic doped n+ type LPCVD silicon fill 210 forms a junction 270 in the substrate 10. A trench-top oxide (TTO) 250 is then deposited over the substrate thereby coating a surface of the pad nitride layer 15 and the planar surface of the buried strap connection 240 directly contacting the Arsenic doped n+ type LPCVD silicon 210 within the trench 18. In the preferred embodiment, an anisotropic deposition of silicon dioxide such as high-density plasma (HDP) is used to form the trench-top oxide 250 along the horizontal surfaces in trenches 18 and over the pad nitride layer 15 of the substrate. A transistor gate dielectric 260 is then formed in the trenches 18 along the sidewall 261 of the upper region of the trench, directly contacting the exposed portions of substrate 10, over a portion of the trench-top oxide 250.

Figure 12:
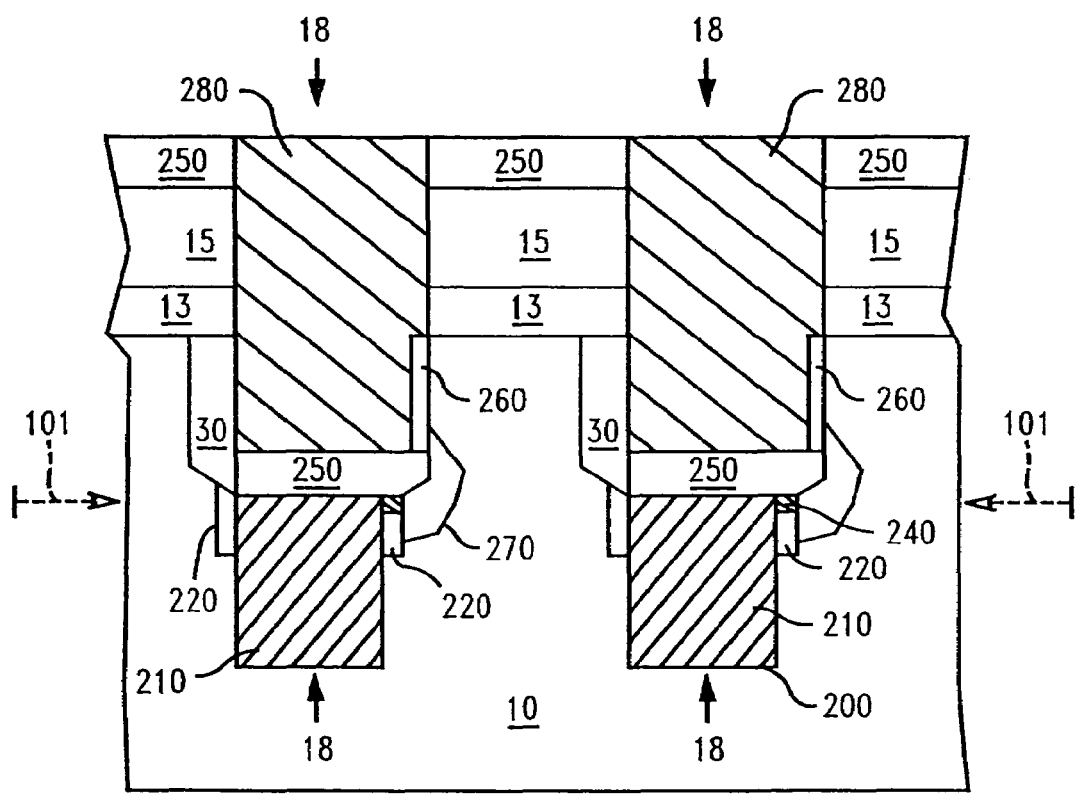
Figure 13A:
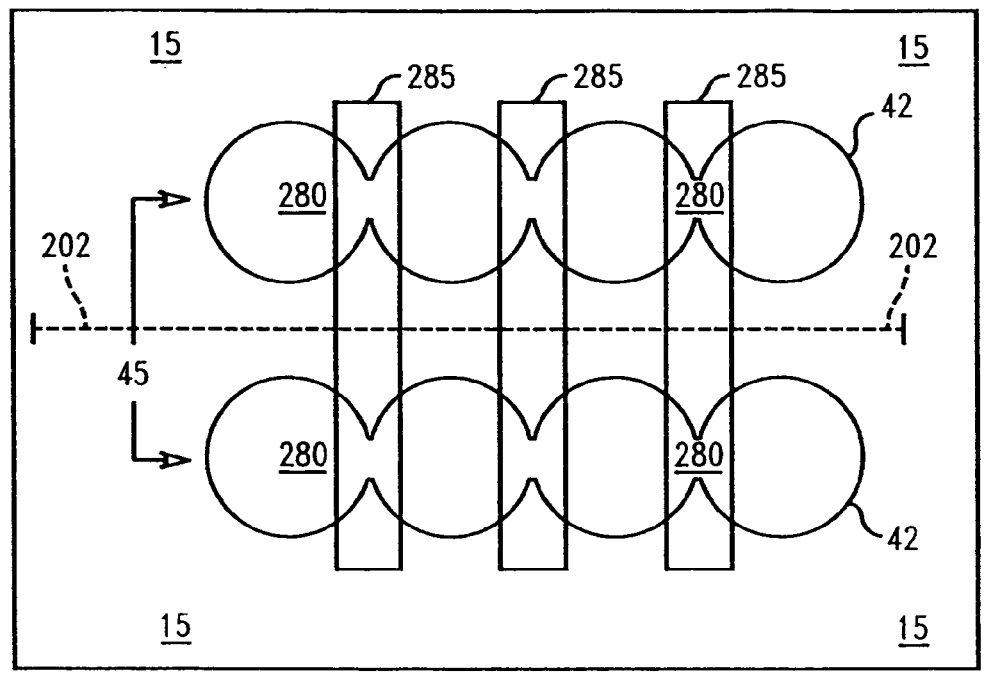
FIG. 13A is a partial top plane view of the substrate of FIG. 12.
Figure 13B:
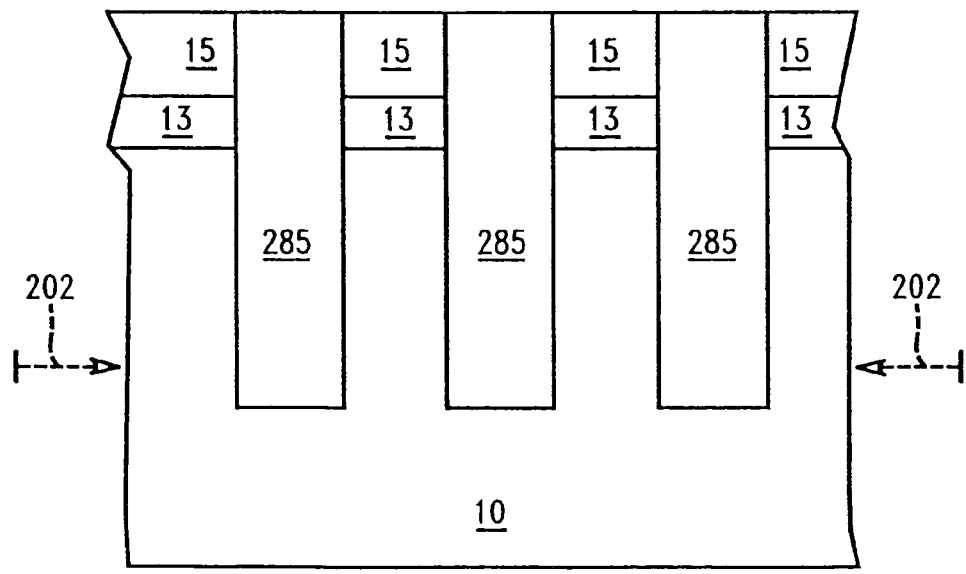
FIG. 13B is a partial cross-sectional view along dashed line 202 in FIG. 13A showing shallow trench isolations 285 formed therebetween the adjacent active rows 45 of paths of trenches to provide isolation for the IC transistors in the peripheral regions of the transistor and to isolate the adjacent memory cell in the arrays.
Figure 14:
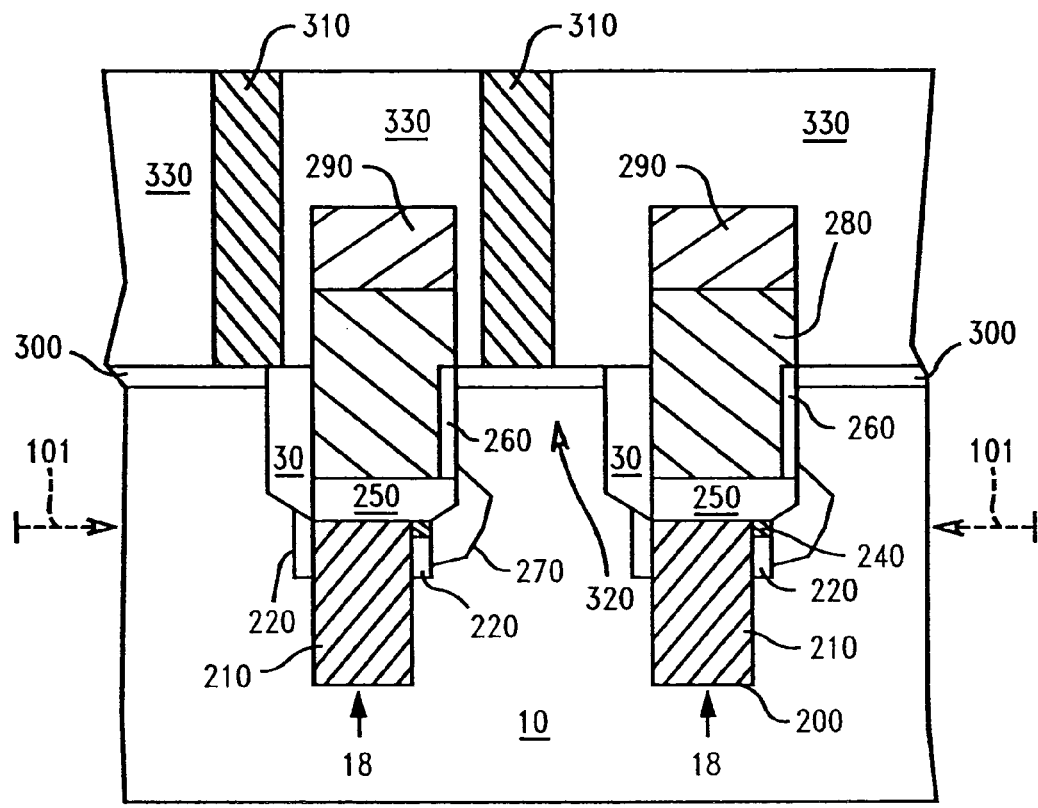
Figure 15:
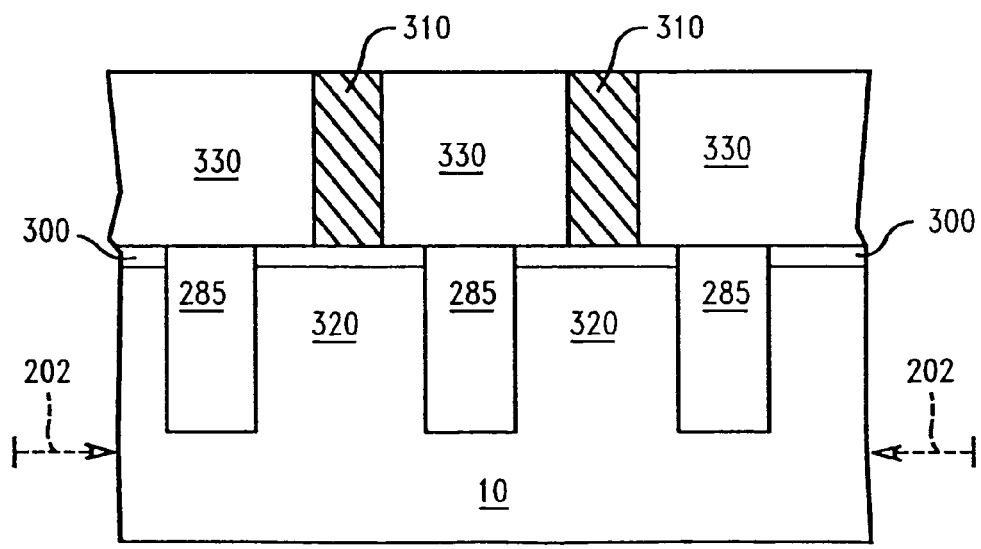

Next, as illustrated in FIG. 12, a trench gate electrode material 280 such as LPCVD silicon may be deposited over the substrate to at least fill the empty portions of the trenches 18. The trench gate electrode material 280 is then planarized to a top surface of the pad nitride layer 15, thereby removing any trench-top oxide 250 remaining over the surface of the pad nitride layer 15, as illustrated in FIG. 13B. Shallow trench isolations (STI) 285 may then be formed in the substrate. As illustrated in the top plane view of FIG. 13A and in the partial cross sectional view of FIG. 13B along the dashed line 202 in FIG. 13A, the STIs 285 are formed therebetween the adjacent active rows 45 of paths of trenches 42. The STIs 285 are formed by known techniques including photolithography, dry etch, HDP oxide deposition, planarization, and the like to a depth ranging from about 300 nm to about 600 nm, preferably to about 400 nm. In the present invention, the STIs 285, as shown in FIG. 13B, are formed to provide isolation for the IC transistors in the peripheral regions of the transistor and to isolate the adjacent memory cells in the arrays. The STI 285 will be substantially perpendicular in orientation in relation to the merged isolation regions 30 as shown in FIG. 6, thereby providing isolation for individual memory cells.

Figure 16:
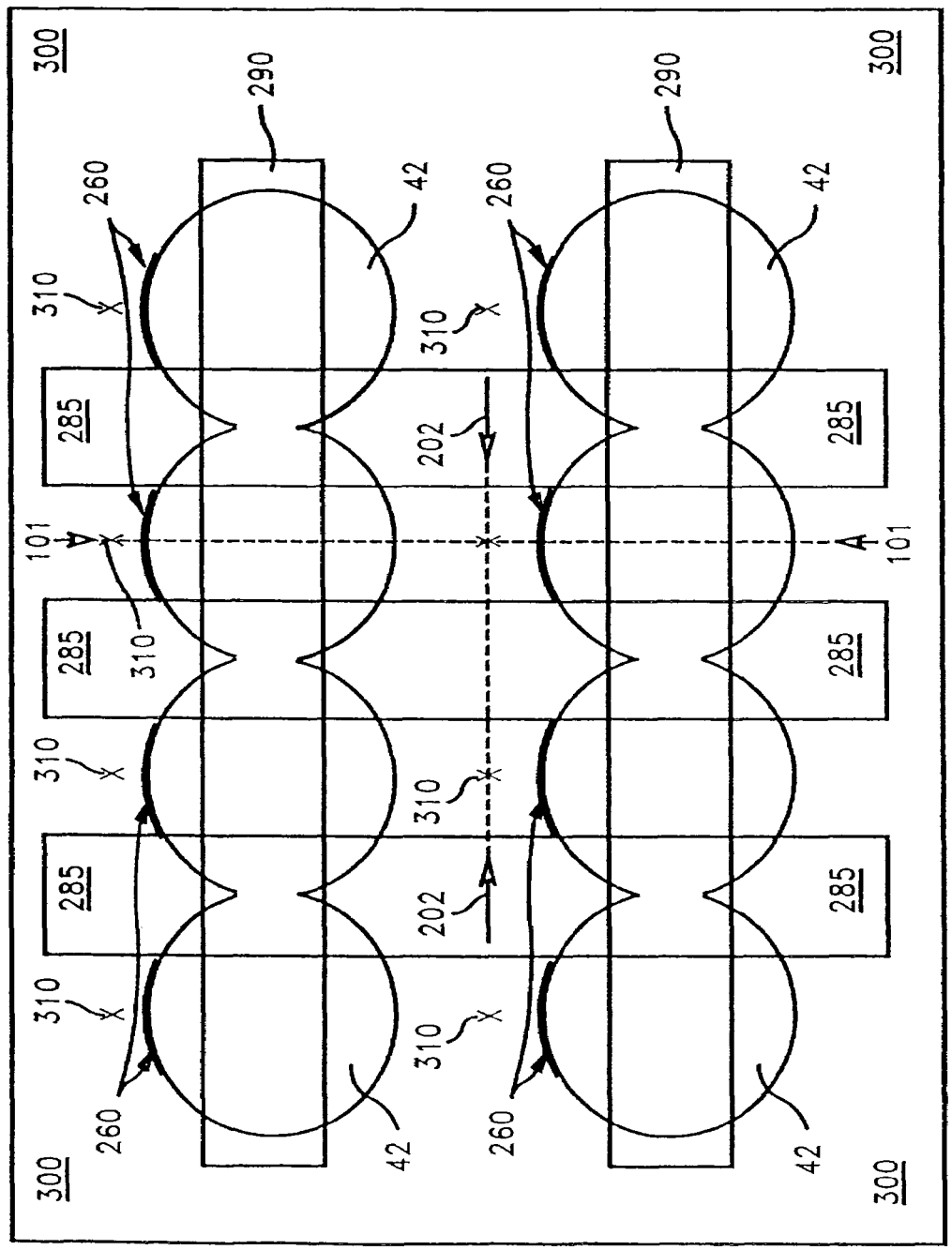
FIG. 16 is a partial top plane view showing a partial layout of the memory cell array of FIG. 15.

Subsequently, the memory structure is completed by techniques known and used in the art. As illustrated in the partial cross sectional view of FIG. 14 along dashed line 101, and in the partial cross sectional view of FIG. 15 along dashed line 202 of FIG. 16, in the preferred embodiment the memory cell structure may be completed by providing a p-well 320 by a first ion implantation process, a surface n+ region 300 by a second ion implantation process, a wordline conductor 290 which may be patterned using lithography and dry etching, and a bit diffusion contact 310 formed into interlevel dielectric 330 using conventional processing techniques. The completed memory cell structure is further illustrated in the top plane view of FIG. 16 showing a layout of the memory cell array. As illustrated, the merged trench regions 42 are connected along the surface of the substrate using wordline pattern 290, whereby STIs 285 provide isolation along the columns and wherein bit contacts 310 are indicated schematically as "x". As further illustrated, the channel regions 260 are along a single side of each trench 18 and along a single side of the path 42 comprising a set of trenches 18.

Thus, the present invention may be used in forming both DRAM and EDRAM memory arrays. As will be recognized, the present invention is particularly useful in the formation of EDRAM arrays wherein borderless bitline contacts are typically not used, and the wordline pitch must be relaxed to accommodate the extra space needed for the bit-line contacts. Furthermore, the self-alignment of the upper portion of the deep trench, particularly the self-alignment of the shallow trench isolation within the plurality of trenches allows for a tight bitline pitch to be used. As it is desirable to provide, in the horizontal direction, close spacing between deep trenches to form the self-aligning isolation regions, the present invention provides improved close spacing which is tighter and/or smaller in comparison to conventional isolation schemes which require additional steps such as those including the alignment of a separate mask. In the present invention, in allowing the formed storage trenches to be closely spaced, the resultant memory cell array is provided with improved density advantages.

Thus, the present invention eliminates the need for an isolation mask by providing an apparatus and method of forming a self-aligned shallow trench isolation structure in a memory cell array which defines the isolation region within a memory cell array during IC fabrication, thereby decreasing manufacturing costs, times, as well as complexity of the resultant high-density memory product. The present invention also eliminates the need for a fine feature size lithographic masking level in an array. Furthermore, the present invention provides an efficient and reliable isolation process to isolate the smaller active and passive circuit elements of modern ICs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An isolation structure in a semiconductor substrate comprising:
   a semiconductor substrate;
   a plurality of adjacent trenches in said semiconductor substrate; and
   a self-aligned isolation structure in upper portions of selected ones of said plurality of trenches, said isolation structure being merged portions of said semiconductor substrate along at least a first row of said selected ones of said plurality of adjacent trenches, said merged portions of said semiconductor substrate being aligned as-formed to edges of said plurality of adjacent trenches,
   wherein said self-aligned isolation structure isolates a first region of said semiconductor substrate from a second region of said semiconductor substrate.

2. The structure of claim 1 wherein said semiconductor substrate comprises a silicon substrate.

3. The structure of claim 1 further including a pad dielectric layer thereover a surface of said semiconductor substrate.

4. The structure of claim 3 wherein said pad dielectric layer comprises a pad oxide layer followed by a pad nitride layer.

5. The structure of claim 4 wherein said pad oxide layer has a thickness ranging from about 1 nm to about 10 nm.

6. The structure of claim 4 wherein said pad nitride layer has a thickness ranging from about 50 nm to about 500 nm.

7. The structure of claim 1 wherein said plurality of adjacent trenches have depths ranging from about 250 nm to about 10μm.

8. The structure of claim 1 wherein said self-aligned isolation structure comprises a thermal oxide region existing along said at least first row of selected ones of said plurality of adjacent trenches.

9. The structure of claim 8 wherein said semiconductor substrate comprises a silicon substrate and said thermal oxide region comprises a thermal silicon dioxide region existing along said at least first row of selected ones of said plurality of adjacent trenches.

10. An isolation structure in a semiconductor substrate comprising:
    a silicon substrate having a layer of pad oxide disposed thereover said silicon substrate and a layer of pad nitride disposed thereover said pad oxide;
    a plurality of adjacent trenches traversing through said pad oxide, said pad nitride, and stopping in said silicon substrate; and
    a self-aligned, thermal oxide isolation structure in upper portions of said plurality of adjacent trenches, said thermal oxide isolation structure being oxidized portions of said semiconductor substrate merged along at least a first row of selected ones of said plurality of adjacent trenches in said upper portions of said trenches, said oxidized portions of said semiconductor substrate being aligned as-formed to edges of said plurality of adjacent trenches,
    wherein said thermal oxide isolation structure isolates a first region of said semiconductor substrate from a second region of said semiconductor substrate.

11. An isolation structure in a semiconductor substrate comprising:
    a semiconductor substrate;
    a pad dielectric layer thereover a surface of said semiconductor substrate;
    a plurality of adjacent trenches in said semiconductor substrate having depths ranging from about 250 nm to about 10μm;
    a plurality of adjacent segments of said semiconductor substrate between each of said plurality of adjacent trenches;
    an oxidation barrier layer residing in lower portions of said plurality of adjacent trenches;
    a self-aligned shallow trench isolation comprising merged sections of selected ones of said plurality of adjacent segments of said semiconductor substrate along a first row above said oxidation barrier layer.

12. The structure of claim 11 wherein said semiconductor substrate comprises a silicon substrate.

13. The structure of claim 11 wherein said pad dielectric layer comprises a pad oxide layer followed by a pad nitride layer.

14. The structure of claim 11 wherein said oxidation barrier layer is a material selected from the group consisting of local oxidation of silicon, silicon nitride and silicon oxynitride.

15. The structure of claim 11 wherein said oxidation barrier layer has a thickness ranging from about 2 nm to about 50 nm.

16. The structure of claim 11 wherein said self-aligned isolation structure comprises a thermal oxide region existing along said at least first row of selected ones of said plurality of adjacent trenches.

17. The structure of claim 16 wherein said semiconductor substrate comprises a silicon substrate and said thermal oxide region comprises a thermal silicon dioxide region existing along said at least first row of selected ones of said plurality of adjacent trenches.

18. An isolation structure in a semiconductor substrate comprising:

a semiconductor substrate;

a plurality of adjacent trenches in said semiconductor substrate having depths ranging from about 250 nm to about 10µm;

a plurality of adjacent segments of said semiconductor substrate between each of said plurality of adjacent trenches;

an oxidation barrier layer residing in lower portions of said plurality of adjacent trenches;

a self-aligned shallow trench isolation comprising merged sections of selected ones of said plurality of adjacent segments of said semiconductor substrate along a first row above said oxidation barrier layer, wherein said selected ones of said plurality of adjacent segments of said semiconductor substrate comprise those adjacent segments of said semiconductor substrate along said at least first row having a thinned diameter ranging from about ⅕ to about ½ that of a non-thinned, original diameter of said plurality of adjacent segments of said semiconductor substrate.

* * * * *